United States Patent
Cadieux et al.

[11] Patent Number: 6,137,299
[45] Date of Patent: Oct. 24, 2000

[54] METHOD AND APPARATUS FOR TESTING INTEGRATED CIRCUIT CHIPS

[75] Inventors: Robert R. Cadieux, St. Albans; George C. Correia, Essex Junction; Gary R. Hill, Jericho, all of Vt.; Anthonty P. Ingraham, Endicott, N.Y.

[73] Assignee: International Business Machines Corporation, Armonk, N.Y.

[21] Appl. No.: 08/884,276

[22] Filed: Jun. 27, 1997

[51] Int. Cl.⁷ .............................. G01R 31/26; G01R 1/067
[52] U.S. Cl. ........................ 324/757; 324/754; 324/760; 324/765
[58] Field of Search ................... 324/754, 755, 324/757, 758, 760, 765

[56] References Cited

U.S. PATENT DOCUMENTS

| | | | |
|---|---|---|---|
| 4,103,814 | 8/1978 | Nishioka | 228/6 A |
| 4,135,630 | 1/1979 | Snyder et al. | 214/1 BT |
| 4,160,893 | 7/1979 | Meyen et al. | 219/85 BA |
| 4,673,839 | 6/1987 | Veenendaal | 324/754 X |
| 4,799,854 | 1/1989 | Niskala | 414/737 |
| 4,912,399 | 3/1990 | Greub et al. | 324/754 |
| 4,995,157 | 2/1991 | Hall | 29/740 |
| 5,040,291 | 8/1991 | Janisiewicz et al. | 29/840 |
| 5,105,537 | 4/1992 | Datta et al. | 29/884 |
| 5,118,299 | 6/1992 | Burns et al. | 439/74 |
| 5,137,461 | 8/1992 | Bindra et al. | 439/74 |
| 5,163,834 | 11/1992 | Chapin et al. | 439/66 |
| 5,230,632 | 7/1993 | Baumberger et al. | 439/66 |
| 5,237,743 | 8/1993 | Busacco et al. | 29/885 |
| 5,313,157 | 5/1994 | Pasiecznik, Jr. | 324/757 |
| 5,406,210 | 4/1995 | Pedder | 324/757 |
| 5,414,372 | 5/1995 | Levy | 324/765 |
| 5,420,520 | 5/1995 | Anschel et al. | 324/754 |
| 5,469,072 | 11/1995 | Williams et al. | 324/754 |
| 5,475,317 | 12/1995 | Smith | 324/760 |
| 5,497,103 | 3/1996 | Ebert et al. | 324/754 |
| 5,517,125 | 5/1996 | Posedel et al. | 324/755 |
| 5,521,522 | 5/1996 | Abe et al. | 324/758 |
| 5,523,696 | 6/1996 | Charlton et al. | 324/758 |
| 5,550,482 | 8/1996 | Sano | 324/758 |
| 5,559,446 | 9/1996 | Sano | 324/760 |
| 5,570,032 | 10/1996 | Atkins et al. | 324/760 |
| 5,604,446 | 2/1997 | Sano | 324/758 |
| 5,633,122 | 5/1997 | Tuttle | 324/765 X |
| 5,634,267 | 6/1997 | Farnworth et al. | 324/755 X |
| 5,796,264 | 8/1998 | Farnworth et al. | 324/758 |
| 5,818,247 | 10/1998 | Pyun | 324/756 |
| 5,880,590 | 3/1999 | Desai et al. | 324/757 |

FOREIGN PATENT DOCUMENTS

| | | |
|---|---|---|
| 42 23 658 | 7/1992 | Germany . |
| 3-220761 | 9/1991 | Japan . |
| 4-324961 | 11/1992 | Japan . |
| 5-63130 | 3/1993 | Japan . |
| 5-183096 | 7/1993 | Japan . |
| 6-169051 | 6/1994 | Japan . |

Primary Examiner—Glenn W. Brown
Attorney, Agent, or Firm—McGuire Woods; James M. Leas, Esq.

[57] ABSTRACT

Formation of a contact probe having a pattern of dendritic textured contacts complementary to that of a contact pad array on a bare chip allows formation of simultaneous temporary connections to all contact pads of the bare chip at a much reduced compressional force across the chip. The reliability of such connections at such a reduced force allows screening, burn-in and full functional testing of the bare chip at a high throughput by an automated apparatus to exploit potential economies of "known good die" (KGD) processing for limiting or avoiding repair, rework and further processing of less than fully functional chips for complex electronic packages. The compressional force is sensed by a pressure sensor, the output of which controls the advancement of the bare chip toward the contact probe such that the dendritic textured contacts of the contact probe penetrate the contact pads of the bare chip.

32 Claims, 4 Drawing Sheets

METHOD AND APPARATUS FOR TESTING INTEGRATED CIRCUIT CHIPS

BACKGROUND OF THE INVENTION

1. Field of the Invention

The present invention generally relates to testing of integrated circuits and, more particularly, to full functional testing of integrated circuit chips prior to packaging as part of the process of providing "known good die."

2. Background

Single chip packages are tested and burned-in to detect and remove modules that do not meet design operating characteristics and to detect and remove modules that are likely to fail early in system use. With multi-chip module packages (MCM) having dozens or hundreds of chips, a single chip of marginal functionality or reliability is removed from the module and replaced with another chip, requiring a costly rework process, in order to avoid the loss of the other fully functional chips and the complex and costly multi-chip package structure. Alternatively, chips can be fully tested and burned in before they are mounted in a multi-chip module package to avoid the potential for and the costs associated with MCM rework. In this case the testing and burning in must be accomplished either at wafer level or after the chips have been singulated into individual chips so as to provide chip reliability equal to the reliability desired for the packaged device. Chips meeting these specifications are referred to as a "known good die" (KGD).

The testing of chips before they are singulated from the wafer is made easier by the fact that the wafer is easily held in position and the chips on the wafer are in a regular array. However, testing at the wafer level is not usually adequate to meet the package equivalent functionality specification. Difficulties arise because of the inability to provide a wafer probe able to contact all the die pads at the size and pitch they are found on the chip, the inability of the probe to provide signals at a high enough speed to test the speed of the chip, and the difficulty in providing a wafer tester capable of providing a full program of functional test patterns. In addition, burn-in at the wafer level poses many difficulties, such as the need to contact all chips of a wafer at the elevated temperature used for burn-in. Thus full functional testing of singulated chips either in the absence of or accompanying burn-in is desirable.

The full functional testing and burning-in of chips after dicing has been accomplished by bringing a chip in contact with a substrate, simulating a single chip module package throughout the test and burn-in process. The contact methods have included temporary metallurgical connections of the chip to the substrate, such as the reflow of solder bumps to a substrate; the temporary wirebonding of the die to a substrate; or the use of a clamp mechanism to apply pressure to the chip to make intimate physical contact between the chip interconnection pads and the substrate during test and burn-in. However, this single chip test and burn-in method has been very expensive because of the cost of the substrate and the cost of mounting the chip to the substrate and the cost of dismounting the chip once test and burn-in are complete. Although many substrates are reusable, they are rarely reused to their maximum potential and many more substrates are needed to produce the daily required number of known good dies.

Thus, a structure and method that can lower the cost of testing to provide KGD is very desirable, and such a process is provided by the present invention.

SUMMARY OF THE INVENTION

It is therefore an object of the present invention to provide a method and apparatus for testing bare chips which can be automated and which does not require installation of a chip in an assembly, use of a clamp, or metallurgical connection.

It is another object of the invention to provide a method and apparatus for making an array of temporary electrical connections to chips without damage to the chips or connections pads thereon which may be of small dimensions and formed at fine pitches.

It is a further object of the invention to provide an array of temporary connections to contact chip pads of small dimensions and fine pitch at low cost and process complexity.

It is yet another object of the invention to provide a large number of reliable temporary connections within an area comparable to that of a chip or die and which can accommodate any connection pad size and pitch lithographically available for the fabrication of integrated circuits.

In order to accomplish these and other objects of the invention, a probe for making simultaneous connections to an array of contact pads formed at small size and fine pitch is provided including a substrate, an array of metal connection pads on the substrate complementary to the array of contact chip pads and having a dendritic texture, and electrical connections to respective metal connection pads of the array of metal connection pads.

In accordance with another aspect of the invention, a method of making a multi-contact probe is provided including the steps of forming a layer of metal having a dendritic texture on a surface of a substrate, and patterning the layer of metal alloy into an array of contact pads.

In accordance with a further aspect of the invention, a method of testing dies is provided comprising the steps of aligning and contacting a die with a probe having an array of contact pads of dendritic texture formed thereon to form connections through the dendrites, applying a compressional force to the die to maintain said connections, and applying signals to the die.

The probe fabricated in accordance with the invention thus can be applied directly to a bare die and can make reliable connections to all contact pads thereof at a much reduced force (by virtue of the dendritic surface texture thereof) which can be reliably applied without damage to the chip by automated pick-and-place apparatus to provide screening of chips prior to burn-in and full functional testing subsequent to burn-in to exploit economies of "known good die" (KGD) processing for complex circuit packages.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
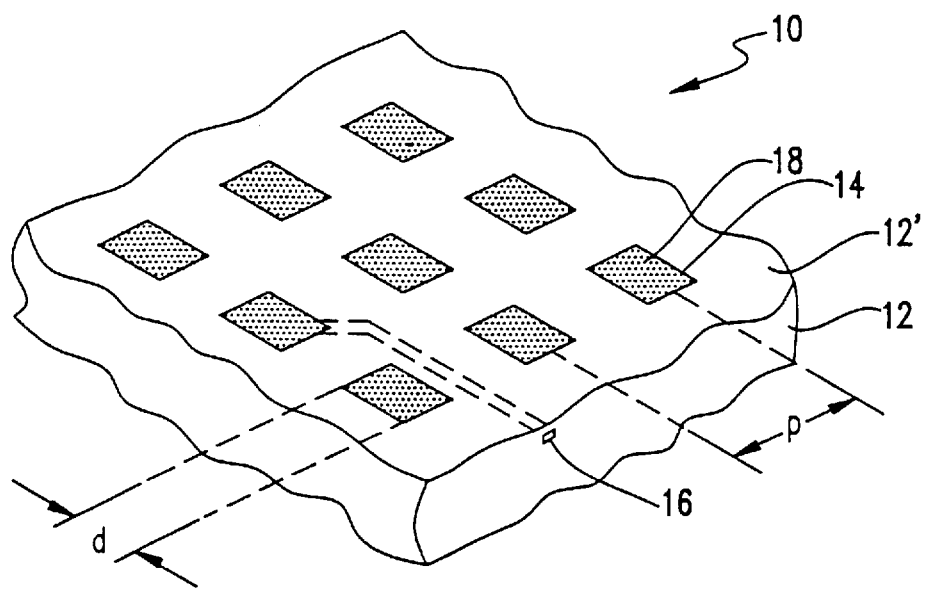
FIG. 1 is a perspective view of a connection array for a probe in accordance with the present invention.
Figure 2:
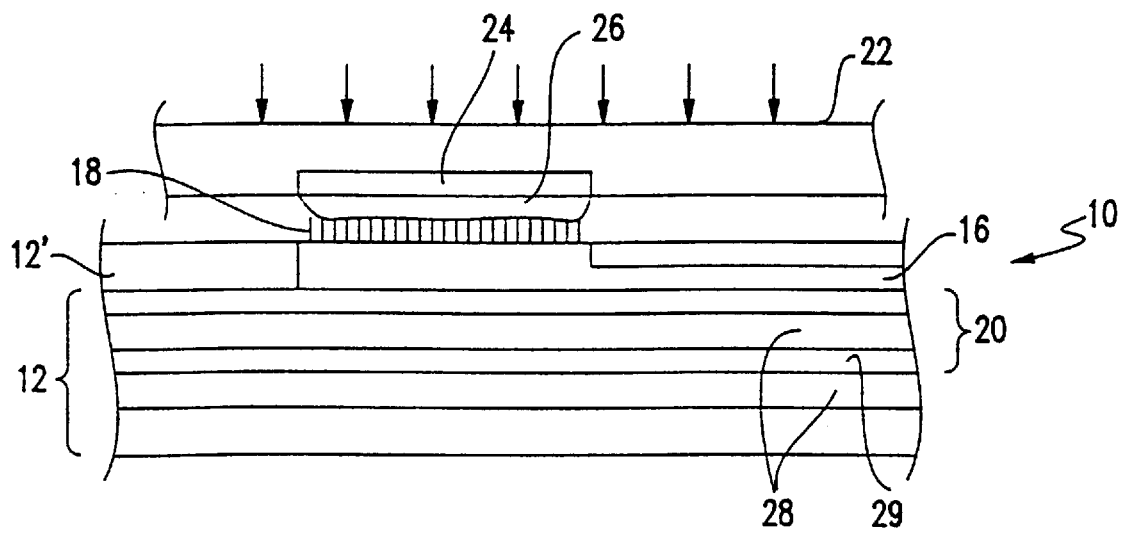
FIG. 2 is an enlarged cross-sectional view of a dendritic contact and connection to a connection pad of a chip in accordance with the present invention.

Referring now to the drawings, and more particularly to FIGS. 1 and 2, there is shown, in FIG. 1, a partially cut-away perspective view of a portion of a probe 10 for making an array of simultaneous temporary connections to a chip in accordance with the invention. An enlarged cross-sectional view of a connection of a single pad 14 of FIG. 1 to a contact pad of a chip or die is shown in FIG. 2. The probe 10 preferably is formed as a substrate layer 12 although the thickness or other geometrical features are unimportant to the practice of the invention. It is also preferred that the substrate layer 12 contain a pressure sensor or a plurality thereof, generally indicated at 20 of FIG. 2, as will be discussed below, which are readily formed as part of a layered structure comprising substrate 12.

On the surface of the substrate 12, a pattern of metallization is formed in any pattern, such as the matrix illustrated, to form an array of pads 14 which is complementary to an array (e.g., a mirror image or partial mirror image thereof) of contact pads on a chip to which connections are to be made. Connections from the respective pads (to increase spacing for other connections made to the substrate 12, such as for a test apparatus) are preferably formed by buried (e.g., under a surface insulator 12') or otherwise insulated conductors 16.

It should be appreciated that conductors 16 and the pattern of pads 14 can be formed by any known lithographic, screening, etching, etc. technique which can be applied to the formation of integrated circuits and thus pads 14 can be made of a size, d, and spacing or pitch, p, to correspond to any chip contacts that can be formed by similar procedures. Once formed, or during the formation of the pads or a metallization layer which may be later patterned into pads, the metal of pads 14 is deposited as a mixture of several metals or as layers of different metals which may be heat treated (e.g., during deposition or before or after patterning) to form an alloy of those metals.

Figure 4:
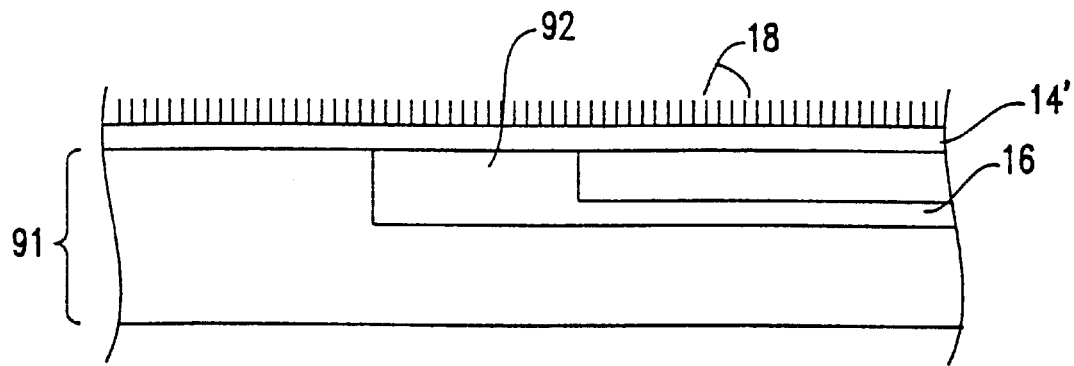
FIGS. 4 and 5 illustrate a preferred method of fabricating the probe connection array of FIGS. 1 and 2, and FIGS. 6, 7 and 8 illustrate an alternative method of fabricating the probe connection array of FIGS. 1 and 2.
Figure 5:
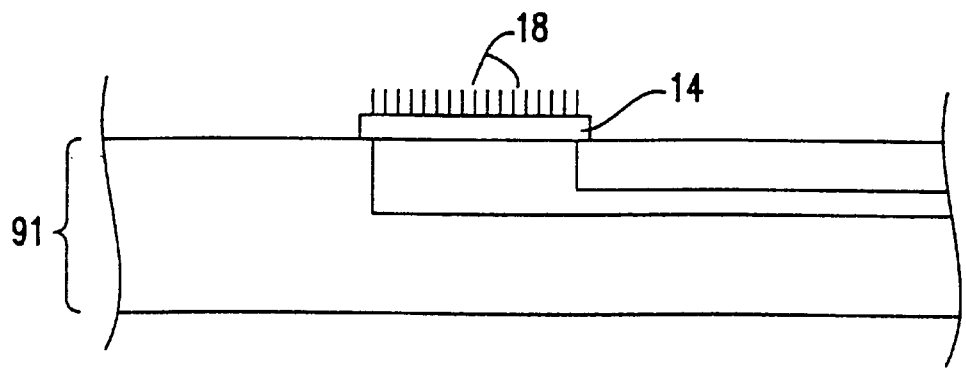

For example, referring to FIGS. 4 and 5, if the probe substrate is of a structure similar to that of a known multi-layer module or multi-layer ceramic structure (MLC), insulated conductors 16 will already have been formed within the probe body or substrate (collectively indicated at 91) and connections to the surface 92 formed as filled vias in a lamina thereof. In such a case, it is sufficient to simply plate one or more layers of metal or a mixture of metals 14' on the surface of substrate 91 (e.g., by an electrolyzation process) and to form the dendritic texture 18 by plating of a metal insoluble in the surface metal of layer 14' or by heat treatment, as alluded to above either before or after patterning layer 14' to form pads 14 as shown in FIG. 5 by etching or other known process. In this regard, it is sufficient to etch or otherwise remove the material of layer 14' and the etching process need not attack the dendrite material. Alternatively, pads 14 can be formed in a patterned manner by selective plating (e.g., electroplating) of the metal to limit plating to selected areas.

Suitable materials and process parameters for forming dendrites of satisfactory properties for practice of the invention are well understood by those skilled in the art. In general, the amount of each of the different metals is chosen such that there will be a significant excess of at least one highly conductive material, such as copper or palladium, which will be rejected from the solution of metals forming the alloy while still mobile within the molten alloy or alloy matrix as temperature is varied during the heat treatment (e.g., during relatively slow cooling). The rejected metal or metals thus form hard, durable upstanding crystalline dendrites 18 of the rejected metal or metals which rise up to several mils above the exposed surface of pads 14. As alluded to above, dendritic textures may also be formed directly, by plating of a metal layer with a metal which is insoluble therein.

Figure 6:
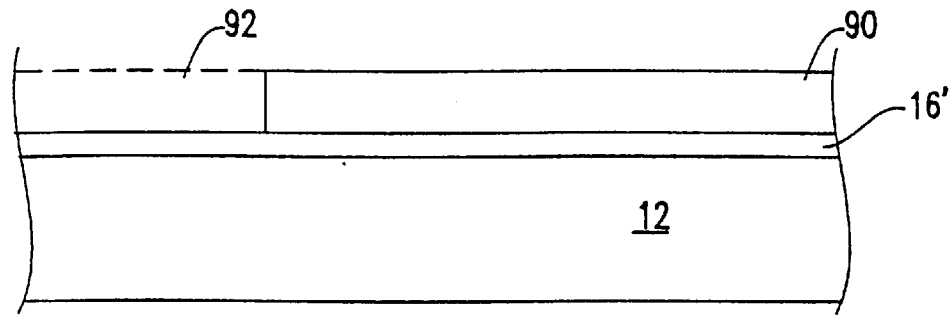
Figure 7:
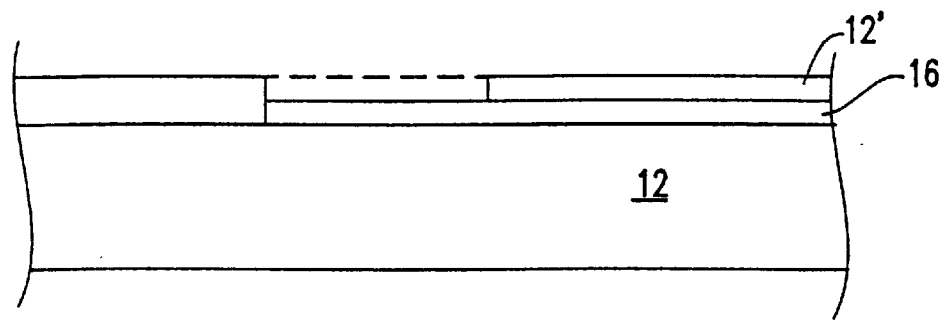
Figure 8:
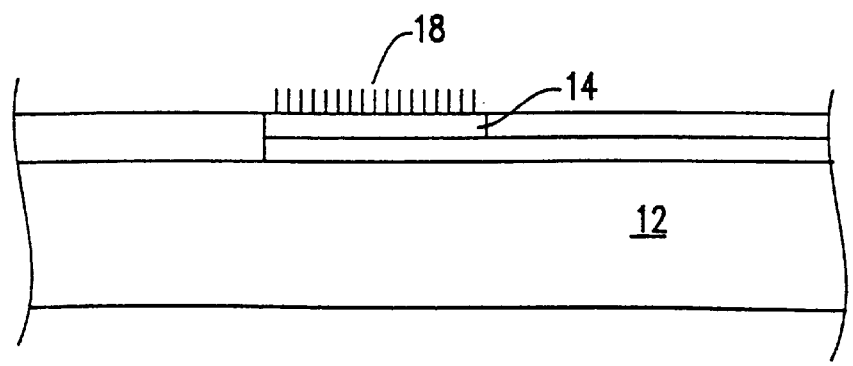

As another example, referring briefly to FIGS. 6–8, a layer of metal 16' is deposited on substrate 12 by any known method such as plating or evaporation and covered with a blanket resist layer 90 which is then patterned as indicated at 92 by any suitable method such as exposure and development. Layer 16' can then be patterned by etching in accordance with the patterned resist. Then, as shown in FIG. 7, an insulator layer 12' is similarly deposited and patterned. The contact pad 14 with dendrites 18 thereon can then be formed by deposition (e.g., by plating, chemical vapor deposition, evaporation or the like) of a mixture of metals, as discussed above, directly or by concurrent or subsequent heat treatment, as shown in FIG. 8.

Alternatively, a groove can be etched in the substrate by the same or similar technique, a layer of metal applied and conductor 16 formed in accordance with the groove by planarization to the substrate surface. In such a case, pad 14 can be formed as a layer 14' as discussed above in connection with FIG. 4 and later patterned since the thickness of resulting pad 14 can easily be arranged to provide sufficient relief of conductor 16 which at or below the surface of the substrate and insulator layer 12' can be omitted but, if desired, may be formed and patterned prior to deposition of pads 14 and formation of the dendritic texture 18 as described above.

Referring now to the enlarged view of FIG. 2, the formation of a temporary contact to a chip contact pad 24 by a pad 14 of the probe 10 will now be discussed. It should be understood that the planarity of the major surfaces of chip or die 22 including contact pads 24 are assumed to be within a maximum tolerance of about 2 mils. In practice, the planarity is generally within a fraction of a mil. This planarity, even at the maximum tolerance, compares very favorably with a dendrite height of several mils to provide reliable connections.

It is considered preferable but not necessary to the practice of the invention to apply a soft metal (e.g., an alloy of tin and lead) such as solder 26 to contact pads 24. Solder bumps or preforms could also be applied in the same fashion. In any case, the regularity of size of solder preforms and the height of solder bumps (due to surface tension effects and the dimensions of the contact pads) will result in a planarity of the lower surface thereof comparable to the planarity of the chip itself. The same will be true for a thin soft metal coating 26 illustrated.

When connection pads 24 are aligned with probe pads 14 and the chip or die 22 and the probe 10 pressed together, the upstanding ends of dendrites 18 will press slightly into pad 24 and/or soft metal coating 26, piercing any oxide coating which may be present thereon. Electrical conduction between the pads 14 and the pads 24 is thus carried through the highly conductive dendrite formations 18. At the same time, the contact pads 24, soft metal coating or solder preforms or bumps 26, whichever is used or exposed, are slightly roughened by the pressing of the dendrites 18 into the surface thereof which pierces any oxide or contamination present.

It should also be recognized that the pressing of the dendrites 18 into the surface of pad 24 and/or soft metal coating or solder bumps or preforms 26 can be accomplished at a relatively low compressive force on the chip since the cross-sectional area of each dendrite is very small and concentrates the force applied to the area of the dendrites 18 while supporting the chip over substantially the entire area of the connection pad. It has been found that a compressional force of less than half the force per connection pad which is conventionally applied is adequate to develop a low-resistance contact through the many dendrites on each pad.

It should be appreciated that since the contact pads are closely and regularly spaced over substantially the entire area of chips or dies of modern design, the compressional force on the chip or die will be evenly distributed over the area of the pad array which generally covers the entirety of a major surface of the chip or die area in modem chip designs. The reduced contact force per connection pad thus remains well below levels of compressional force or shear forces resulting therefrom which can cause chip damage even when total compressional force becomes too large to correspond to large numbers of contact pads.

In this regard, it is preferable to provide a pressure sensor, generally indicated at 20 of FIG. 2, within substrate 12 of probe 10 in order to regulate compressive force applied consistent with maintenance of low resistance electrical connections to the chip or die 22. The inclusion of such a sensor 20 should be regarded as a perfecting feature of the invention and is not essential to the successful practice thereof. Likewise, the details and particulars of the sensor are unimportant to the practice of the invention and any known type of pressure sensor (e.g., capacitive, piezoelectric, resistive strain gauge, fiber optic, etc.) can be used. A capacitive pressure sensor is slightly preferred since conductive layers 28 and an intervening dielectric 29 can be most conveniently and economically included within substrate 12 and forms a durable, reliable and easily calibrated sensor.

Figure 3:
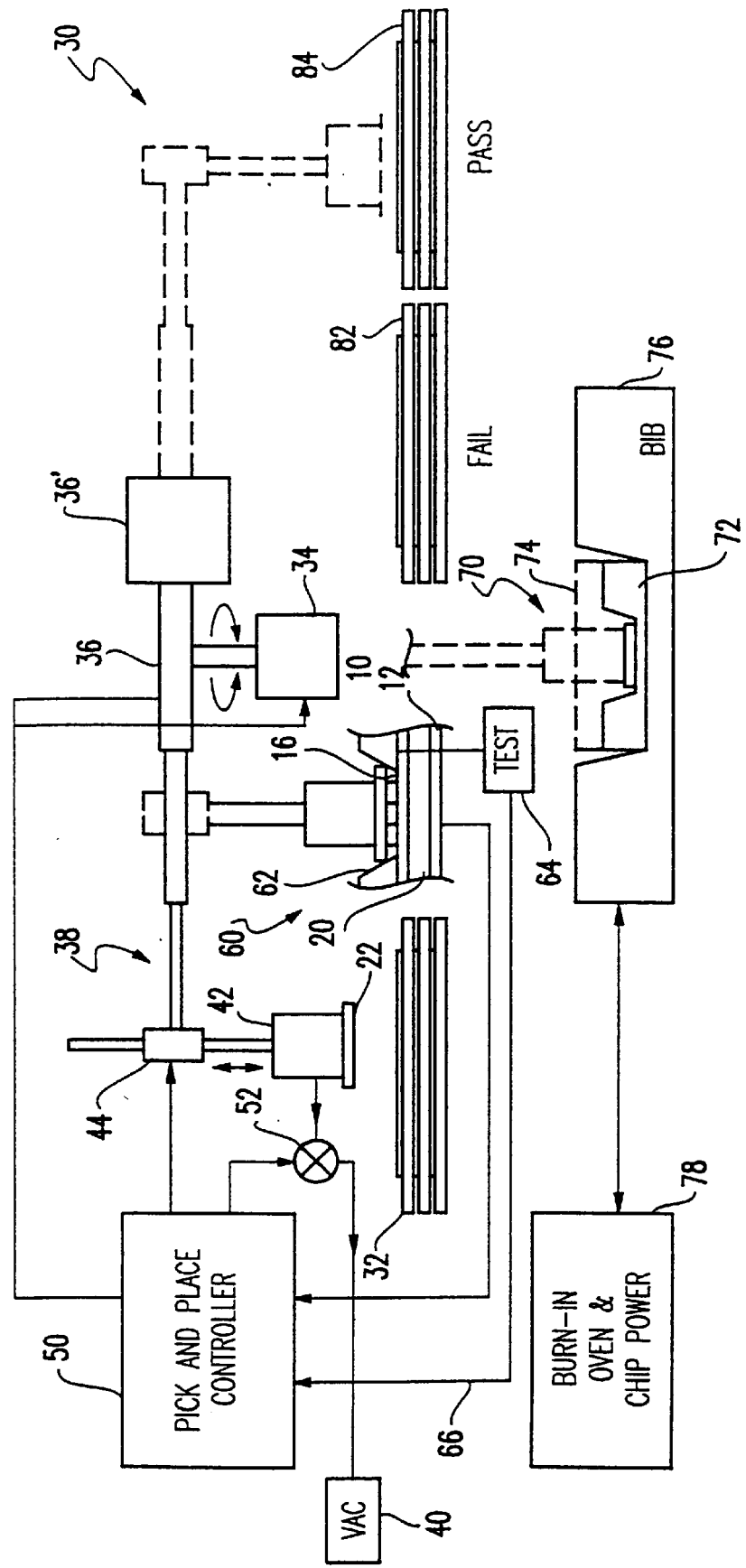
FIG. 3 is a schematic view of a die transport and test apparatus in accordance with the invention.

Referring now to FIG. 3, an automated testing arrangement exploiting the capabilities of the probe 10, described above, will now be discussed. It should be understood that formation of circuit elements and their connections to form integrated circuits is accomplished by processing of relatively large wafers which are later diced into chips or dies. While it is considered preferable to perform bum-in and testing of individual chips, with reference to which some aspects of the invention will be described, below, it should be understood that these procedures could also be carried out on wafers prior to dicing in accordance with the principles of the present invention although such a practice is not preferred.

It should also be understood from the following discussion that it is considered preferable for KGD processing to initially test each chip prior to burn-in, perform burn-in only on the chips that initially test as "good" (since burn-in is particularly time-consuming and occupies expensive apparatus) and then to again functionally test each chip after the burn-in operation. Each test may include standard functional testing with or without speed consideration, parametric testing, or other desired test methodology. Accordingly, the arrangement in accordance with the invention which will be discussed below or a plurality thereof including an appropriate portion of the structure or group of elements depicted in FIG. 3 can be used for each of these steps.

Assuming that a wafer has been diced into chips and thus is already removably attached to a dicing tape, the chips are placed in a chip bank or other structure suitable for transporting the chips (or they may be left on the dicing tape for transport), generally depicted at 32, and conveyed to a "pick and place" apparatus 30 as schematically depicted in FIG. 3. The pick and place apparatus 30 comprises a gripping arrangement 38 for gripping individual chips (depicted as capable of being raised and lowered), an arm 36 (depicted as telescoping) for transporting the gripping arrangement 38 and a mechanism 34 (depicted as rotary) for moving the arm 36.

Gripping arrangement 38 can be a mechanical clamp but a vacuum pick-up arrangement with a vacuum source 40 and vacuum head 42 is much preferred for avoiding damage to the chips handled thereby. Further, such a vacuum pick-up arrangement is also compatible with applying a compressive force to the chip in accordance with the invention as will be discussed below. For this reason, it is also considered preferable that a mechanism for raising and lowering the vacuum head 42 be provided, as depicted at 44, although the details of the mechanism (e.g., magnetic, pneumatic, worm-geared, etc.), are unimportant to the invention.

Similarly, while arm 36 is depicted as rotationally movable, a linear or other motion could be used. It is only necessary that the arm 36 be capable of transporting the gripping head 42 to the chip testing, transport and assembly or burn-in stations which may be associated with the arm and a telescoping arrangement, as depicted, may not be required. Mechanical details (e.g., counterweight 36 or additional, independently controllable arms 36 carried by the same transport 34) will be evident to those skilled in the art in view of the following discussion of the operation of pick and place apparatus 30. Pick and Place Systems are commercially available from such companies as TALTEC Systems, Inc., Chip Scale Robotics, Bear Technologies and Universal Equipment.

Once chip bank, or other carrier 32 such as a diced wafer on dicing tape is brought to a position accessible by the pick and place apparatus 30, pick and place controller 50 controls motion of arm 36 and arm transport 34 to move the gripping arrangement or pick-up head 42 to an appropriate location to pick-up an individual chip or die (or wafer). The pick-up head 42 is then lowered by mechanism 44 to contact the chip or die and the gripping arrangement is actuated such as by controlling application of a vacuum at valve 52. The pick-up head and chip or die 22 is then raised from the chip bank or dicing tape 32 and the arm 36 is again controlled to move pick-up head 42 to a test station 60.

At test station 60, the chip or die is aligned with probe 10 and lowered to bring it into contact with the dendritic texture 18 of contact pads on substrate 12 of probe 10. Alignment can be achieved in numerous ways familiar to those skilled in the art but it is considered preferable to simply use a mechanical guide such as inclined surfaces 62 to guide the edges of the chip to the desired location. (In this way, dimensional accuracy of the dicing operation and the accuracy of contact locations relative to the chip periphery is also effectively checked.) The opening in the alignment guide may exhibit as tight a tolerance as 0.5 mils greater than the nominal diced dimension of the die.

Contact pressure is preferably regulated at a desired value determined in accordance with the number of contact pads on the chip and probe, as discussed above, by feedback from sensor 20 to controller 50 but could be brought to a desired fixed value in a number of other ways (e.g., servo-motors or pneumatically). However, since reliable temporary contacts can generally be made at a low pressure by virtue of the dendritic contact pad texture but may require increased pressure to compensate for probe wear, a feedback arrangement including functional testing 64, 66 is preferred to avoid false negative test results from insufficient contact pressure.

Once a desired degree of initial functional testing has been successfully carried out under control of tester 64, a signal 66 is provided to pick and place controller 50 to cause the chip or die 22 to be raised from probe 10 and transported to burn-in station 70. Specifically, an assembly 72 is provided to receive the chip and make at least power connections thereto so that power can be supplied to the chip during the burn-in process. Inclined guide surfaces similar to inclined guides 62, described above, can be provided to assist in this process, if desired, although any other suitable alignment procedure can be used. Temporary contacts are maintained through pressure applied through a clamping arrangement schematically indicated by dashed line 74. Any number of carrier assemblies may be attached to burn-in board (BIB) 76 and any number of burn-in boards may be manually or, preferably, mechanically transported as part of the automated KGD processing in accordance with the invention to burn-in oven 78. Burn-in is thus preferably performed simultaneously on a plurality of chips in view of the extended time generally required for doing so.

It is to be understood that while use of an assembly 72 to contain and make electrical connections to the chip, including a clamping fixture 74, is currently preferred for connection to a bum-in board (BIB) 76 and handling of the chip during the burn-in procedure (e.g., to convey the chip to a burn-in oven to provide an elevated temperature while power is applied to the chip). Other arrangements including a dendritic probe in accordance with the invention could also be used and the chip directly inserted into and held within the burn-in oven 78. However, such an alternative is not currently preferred since the period required for burn-in is much longer than the period required for functional testing and would dominate the throughput of a single pick and place machine 30. If a different pick and place apparatus were used for the burn-in operation, numerous such machines would be needed to match the throughput of the testing procedure and, therefore, the use of numerous complex automated machines essentially to maintain a static pressure on the chip during the entire burn-in process is not presently considered to be economically justifiable.

Once burn-in, the details of which are not important to the practice of the invention, is completed, the chip or die is extracted from the assembly 72, 74 and again picked up by gripping arrangement 42 for movement to a testing station. Testing station 60, described above, could be used in this process or an additional testing station provided, as may be convenient. It should also be understood that a different testing station need not be on the same pick and place apparatus 30 as testing station 60, particularly since the use of an assembly 72 during burn-in provides for safe transfer of the chip or die between whatever locations may be required or convenient.

Testing subsequent to burn-in is generally similar to the initial testing described above. However, initial testing may be abbreviated as overall economy and throughput may dictate while substantially full functional testing should be conducted subsequent to burn-in if the potential benefits of KGD processing are to be realized. Upon completion of the testing subsequent to burn-in under control of tester 64, a signal 66 is again sent to the pick and place controller 50 to control the arm 36 to direct the chip to an appropriate chip bank such as 82 if the chip is not fully functional or 84 if the chip tests as "good." It will be recognized that this procedure is essentially a sorting operation and more than one chip bank for passing chips as well as a chip bank for failing chips can be provided, depending on the discrimination capabilities of the test. For example, a chip that is fully functional only at clock speed below design clock speed could be marketable as a stand-alone device having suitably de-rated specifications but would be unsuitable for use in modular packages with other chips.

In summary, chips or dies (or wafers) are made accessible to the pick and place apparatus in accordance with the invention from chip bank 32 or other carrier from which chips or dies are individually picked up, in turn, and transported to testing station 60. Temporary connections are made to the chip or die (or wafer) through dendrites formed on connection pads of probe 10 and maintained through pressure preferably regulated by a feedback arrangement from pressure sensor 20. After initial testing, the chip or die (or wafer) is removed from test station 60 and, if good, automatically placed in an assembly 72 for burn-in. After burn-in, the chip or die (or wafer) is subjected to full functional testing at test station 60 or a similar station of the same or a different pick and place apparatus and sorted onto one of a plurality of chip banks 82, 84 in accordance with results of the full functional test of each chip accomplished in accordance with the invention.

In view of the foregoing, it is seen that the invention provides a clampless probe for making reliable temporary connections from small and closely spaced connections pads on the probe to a bare chip or soft metal/solder coatings, bumps or preforms thereon. The connections are made at much reduced forces than otherwise possible and enhance the texture of the chip connection pad surfaces for later soldering. The ability to form such connections which accommodate chip geometry allows reduction or avoidance of the time a chip must occupy an expensive assembly as well as the full automation of KGD processing to eliminate the cost of further processing (e.g., packaging) of chips which may be defective or perform at less than full design specifications. The ability to make reliable temporary connections to chip pads of small size and fine pitch without the use of an assembly to contain the chip or other intervening structure permits the complete automation of the burn-in and testing operations necessary to obtain the potential economic benefits of KGD processing. Patterning to form the contacts of dendritic texture of the probe can accommodate any size or pitch of contact pads which can be developed on a chip and the dendritic texture of the probe contacts reduces required contact pressure and improves the surface of the contact pads on the chip for subsequent permanent attachment to other structure by soldering.

While the invention has been described in terms of a single preferred embodiment, those skilled in the art will recognize that the invention can be practiced with modification within the spirit and scope of the appended claims.

Having thus described my invention, what I claim as new and desire to secure by letters patent is as follows:

1. A method of testing a bare die, comprising the steps of:
    a) providing a bare die having pads for external connection;
    b) providing a penetrating probe for electrically contacting the pads, said probe including a pressure sensor;
    c) aligning said die over said probe;
    d) advancing said die so that the pads on said die contact said probe;
    e) sensing, with said pressure sensor, compressive force applied by said die against said probe;
    f) further advancing said die into a testing position based on signals indicative of the compressive force output from the pressure sensor; and
    g) testing said die.

2. A method as recited in claim 1, wherein in said providing step (a) said die is provided mounted on a chip placement tool arm.

3. A method as recited in claim 2, wherein in said providing step (a) said chip placement tool arm picks up said die, in said aligning step (c) said die is automatically aligned, and after said testing step (e) said chip placement arm sorts said die according to its functionality.

4. A method as recited in claim 1, wherein said pads are one of solder bumps and wire bond pads.

5. A method as recited in claim 1 further comprising a sensor and an electronic feedback circuit to provide and maintain a desired force on said pads.

6. A method as recited in claim 1, wherein said aligning step (c) involves automatically aligning.

7. A method as recited in claim 6, wherein said automatic aligning is provided mechanically.

8. A method as recited in claim 6, wherein said mechanical aligning is with a funnel shape guide.

9. A method as recited in claim 1, wherein the dendrites of said probe are non-resilient probe elements.

10. A method as recited in claim 1, where said test includes functional test.

11. A method as recited in claim 10 wherein said functional test includes speed sorting.

12. A method as recited in claim 1, wherein said probe includes dendrites, and wherein said further advancing step includes advancing said die based on said signals until the dendrites penetrate the pads on said die.

13. A method as recited in claim 12, wherein said further advancing step includes compressing said die against said probe based on said signals by an amount sufficient to cause the dendrites of said probe to penetrate a predetermined distance into the pads of said die.

14. A method as recited in claim 1, further comprising:
forming said probe as a multiple-layer substrate which includes the pressure sensor in one of said layers.

15. A method as recited in claim 1, further comprising:
holding said die in said testing position solely as a result of pressure applied by a chip placement tool arm against said die as said die is held in said testing position.

16. A structure for probing an integrated circuit device, comprising:
mechanical means for holding a diced chip;
a substrate having a plurality of penetrating probes for mechanically contacting the chip, said substrate including a pressure sensor; and
a force providing means for advancing the chip until pads on the chip make electrical contact with the penetrating probes;
wherein said pressure sensor senses a compressive force applied by said chip against said penetrating probes, said force providing means advancing the chip against the penetrating probes into a testing position based on signals indicative of the compressive force output from the pressure sensor.

17. A structure as recited in claim 16, wherein said probes include a multiple-layer substrate with the pressure sensor included in one of said layers.

18. A structure as recited in claim 16, wherein said substrate comprises one of a ceramic, a semiconductor, a card, and a flex.

19. A structure as recited in claim 16, wherein said mechanical means comprises a vacuum.

20. A structure as recited in claim 16, wherein said force providing means comprises an arm capable of picking up the chip from a chip carrier and placing the chip on the substrate.

21. A structure as recited in claim 16, wherein said force providing means comprise servo motors.

22. A structure as recited in claim 16, wherein said mechanical means for holding said chip comprises a funnel-shaped guide.

23. A structure as recited in claim 16, wherein each of said probes includes dendrites.

24. A structure as recited in claim 23, wherein said force providing means compresses the chip against said probes by an amount sufficient to cause the dendrites of said probes to penetrate a predetermined distance into the pads of said chip.

25. A method of testing, comprising the steps of:
a) providing an electronic component to be tested, wherein said component has a contact pad;
b) providing a penetrating probe for contacting said pad and for penetrating through a surface of said pad;
c) picking up said component with a transport apparatus;
d) aligning said component so said penetrating probe is aligned with said pad while said component is held in said transport apparatus;
e) providing relative movement between said probe and component to provide contact between said pad and said probe while said component is held in said transport apparatus; and
f) continuing said relative movement to penetrate through a surface of said pad to provide electrical contact while said component is held in said transport apparatus.

26. The method of claim 25, wherein the penetrating probe comprises a dendrite.

27. The method of claim 25, wherein the pad comprises solder.

28. The method of claim 25, wherein the probe penetrates through oxide.

29. The method of claim 25, wherein said transport apparatus comprises an arm for picking up said component, said arm bringing said component into contact with said probe and providing force for said penetrating step (f).

30. The method of claim 25, wherein said aligning step (d) comprises providing a funnel shaped guide adjacent said probe and applying said component to said probe as aligned by said funnel shaped guide while said component is held in said transport apparatus.

31. The method of claim 25, wherein said continuing movement step (f) comprises sensing a force between said probe and said component, and controlling said movement based on said force sensing.

32. The method of claim 25, wherein said continuing movement step (f) is stopped when a specified force is sensed.

* * * * *

UNITED STATES PATENT AND TRADEMARK OFFICE
CERTIFICATE OF CORRECTION

PATENT NO. : 6,137,299
DATED : October 24, 2000
INVENTOR(S) : Cadieux et al.

It is certified that error appears in the above-identified patent and that said Letters Patent is hereby corrected as shown below:

<u>Title page, item [75],</u>
Inventors Section, delete "Anthonty" and insert -- Anthony --.

Signed and Sealed this

Second Day of October, 2001

Attest:

*Attesting Officer*

NICHOLAS P. GODICI
*Acting Director of the United States Patent and Trademark Office*